United States Patent [19]

Carroll et al.

[11] Patent Number: 6,001,701
[45] Date of Patent: Dec. 14, 1999

[54] PROCESS FOR MAKING BIPOLAR HAVING GRADED OR MODULATED COLLECTOR

[75] Inventors: Michael Scott Carroll; Samir Chaudhry, both of Orlando; Alan Sangone Chen, Windermere; Yih-Feng Chyan; Kuo-Hua Lee, both of Orlando, all of Fla.; William John Nagy, Orlando, Pa.

[73] Assignee: Lucent Technologies Inc., Murray Hill, N.J.

[21] Appl. No.: 08/871,385

[22] Filed: Jun. 9, 1997

[51] Int. Cl.[6] .................................................. H01L 21/331
[52] U.S. Cl. ......................... 438/364; 438/202; 438/234; 438/369; 438/527; 148/DIG. 9; 148/DIG. 10; 148/DIG. 11; 257/370; 257/588
[58] Field of Search ..................................... 438/202, 234, 438/309, 527, 364, 369, FOR 169, FOR 219; 148/DIG. 10, DIG. 9, DIG. 11; 257/370, 588

[56] References Cited

U.S. PATENT DOCUMENTS

| | | | |
|---|---|---|---|
| 4,498,227 | 2/1985 | Howell et al. | 29/576 B |
| 4,743,950 | 5/1988 | Roggwiller | 357/20 |
| 4,782,030 | 11/1988 | Katsumata et al. | 148/DIG. 10 |
| 4,962,053 | 10/1990 | Spratt et al. | 438/202 |
| 5,045,493 | 9/1991 | Kameyama et al. | 438/202 |
| 5,137,839 | 8/1992 | Niitsu | 148/DIG. 10 |
| 5,389,563 | 2/1995 | Kuroi et al. | 148/DIG. 10 |
| 5,605,849 | 2/1997 | Chen et al. | 148/DIG. 10 |
| 5,679,586 | 10/1997 | Rodrigues et al. | 148/DIG. 10 |
| 5,719,082 | 2/1998 | Violette | 439/309 |
| 5,780,329 | 7/1998 | Randazzo et al. | 438/202 |
| 5,789,285 | 8/1998 | Yoshihara | 438/309 |
| 5,789,288 | 8/1998 | Palmieri et al. | 438/234 |

FOREIGN PATENT DOCUMENTS

| | | | |
|---|---|---|---|
| 401216573 | 8/1989 | Japan | 438/165 |

OTHER PUBLICATIONS

H.H. Hansen, et al. "Ultra Dense, High Performance Bipolar Transistor", IBM Tech. Dis. Bull., vol. 24, No. 9, Feb. 1982.

Koroi et al, "Bipolar Transistor With A Buried Layer Formed By High–Energy Ion Implantation For Subhalf Micron Bipolar–Complementary Metal Oxide Semiconductor LSIs", Jpn. J. Appl. Phys., vol. 33 (1994), pp. 541–545.

Ahahriar S. Ahmed et al, "A Triple Diffused Approach For High Performance 0.8 $\mu$m BiCMOS Technology", Solid State Technology, Oct. 1992, pp. 33–38.

A. Shida et al., "3.3V BiNMOS Technology Using NPN Transistors Without Buried Layers", IEDM 1991–1993, pp. 4.3.1–4.3.4.

*Primary Examiner*—Wael M. Fahmy
*Assistant Examiner*—Long Pham
*Attorney, Agent, or Firm*—J. Rehberg; A. Grillo

[57] ABSTRACT

A bipolar fabrication process, illustratively suited for integration into a conventional CMOS process to thereby form a BiCMOS integrated circuits is disclosed. The collector and base are formed through multiple implants and a single masking step to thereby provide a continuous low resistance collector region.

7 Claims, 7 Drawing Sheets

PROCESS FOR MAKING BIPOLAR HAVING GRADED OR MODULATED COLLECTOR

TECHNICAL FIELD

This invention relates to bipolar transistor technology.

BACKGROUND OF THE INVENTION

There is an increasing interest in BiCMOS integrated circuit technologies (Bipolar+CMOS) for the performance of mixed function (i.e. analog and digital) functions within a single chip. Particular applications are frequently envisioned in the wireless marketplace. With the tremendous demand for $f_T$ improvement from the circuit design community, BiCMOS technologists still continue to scale down base width to increase NPN device performance. Unfortunately, scaling base width also lowers $BV_{ceo}$, thus giving the device intolerable characteristics for 3.3 volt applications as well as manufacturing difficulties in the production line. Those concerned with the development of bipolar technology, in general and BiCMOS technology in particular have continuously sought improved in $f_T$ values as well as optimized base widths to yield desirable $F_t \, BV_{ceo}$ products. Furthermore, it is desired to have a BiCMOS process with bipolar process modules which can be easily integrated into standard CMOS process modules.

FIG. 1 shows, by way of illustration, a typical conventional cross section of a BiCMOS integrated circuit 11. NPN transistor 19 is formed adjacent CMOS devices 13. Reference numeral 15 denotes a NMOS transistor, while reference numeral 17 denotes a PMOS transistor. Isolation oxides 31 serve to separate individual devices and tubs. For example, the p-tub is denoted by reference numeral 21, while the n-tub is denoted by reference numeral 23. NMOS device 15 is made within p-tub 21 and contains gate structure 27 with source and drain 53. PMOS device 17 is formed in n-tub 23 and contains gate 29 and source and drain 55 and 57. Buried layer 25 is formed beneath n+ tub 23. NPN transistor 19 is formed on top of buried n-tub layer 39. Transistor 19 includes an n+ sinker implant 41, polysilicon emitter structure 33, buried collector 39, emitter 61 and base 35. Region 37 is often termed the "selectively implanted collector." Typically, the fabrication process for the BiCMOS structure 11 begins with formation of a continuous buried layer including regions 25 and 39. Then, an epitaxial layer is formed on top of the buried layer and the appropriate dopings and tub definitions are performed.

Turning again to NPN transistor 19, it will be noted that the principal collector current conduction path is through selectively implanted collector 37, buried layer 39, and sinker 41. There is substantially less collector conduction through n-regions 63 and 67 because of their higher resistivity. (An appropriate collector contact is formed upon surface 43 although not shown.) Bipolar device 19 provides low collector resistance (Rc) and base-collector junction capacitance. However, the process utilized to form the device 11 of FIG. 1 is expensive and complex. It is difficult to integrate the formation of bipolar device 19 into the existing CMOS process modules which form CMOS pair 13 without changing the CMOS device characteristics.

Thus, those concerned with the development of bipolar technology in general, and BiCMOS technology in particular, have continuously sought bipolar devices with superior operating characteristics and have also sought bipolar devices which may be fabricated in the context of a CMOS process without undesirable side effects.

SUMMARY OF THE INVENTION

Ilustratively, the present invention includes:

forming an isolation region extending into a substrate, the isolation region defining first and second portions of the substrate surface;

subjecting the substrate to one or more first type ion implantation steps to thereby create a region which will later become a collector;

subjecting the substrate to a second type ion implantation to thereby create a region below the second portion of the substrate surface which will later become a base;

subjecting the substrate to a first type ion implantation through the second portion of the substrate surface to create a region which will later become an emitter.

In another embodiment, the invention includes a bipolar transistor having:

a substrate;

an isolation oxide extending downward into the substrate, the substrate defining first and second portions of the substrate surface;

an emitter region beneath and contacting a portion of the second portion of the surface;

a base region beneath the emitter region and contacting a portion of the second portion of the surface;

a collector region extending beneath the oxide and contacting the first portion of the surface, the collector having its lowest resistance path beneath and in contact with the oxide.

Detailed Description

Figure 2:
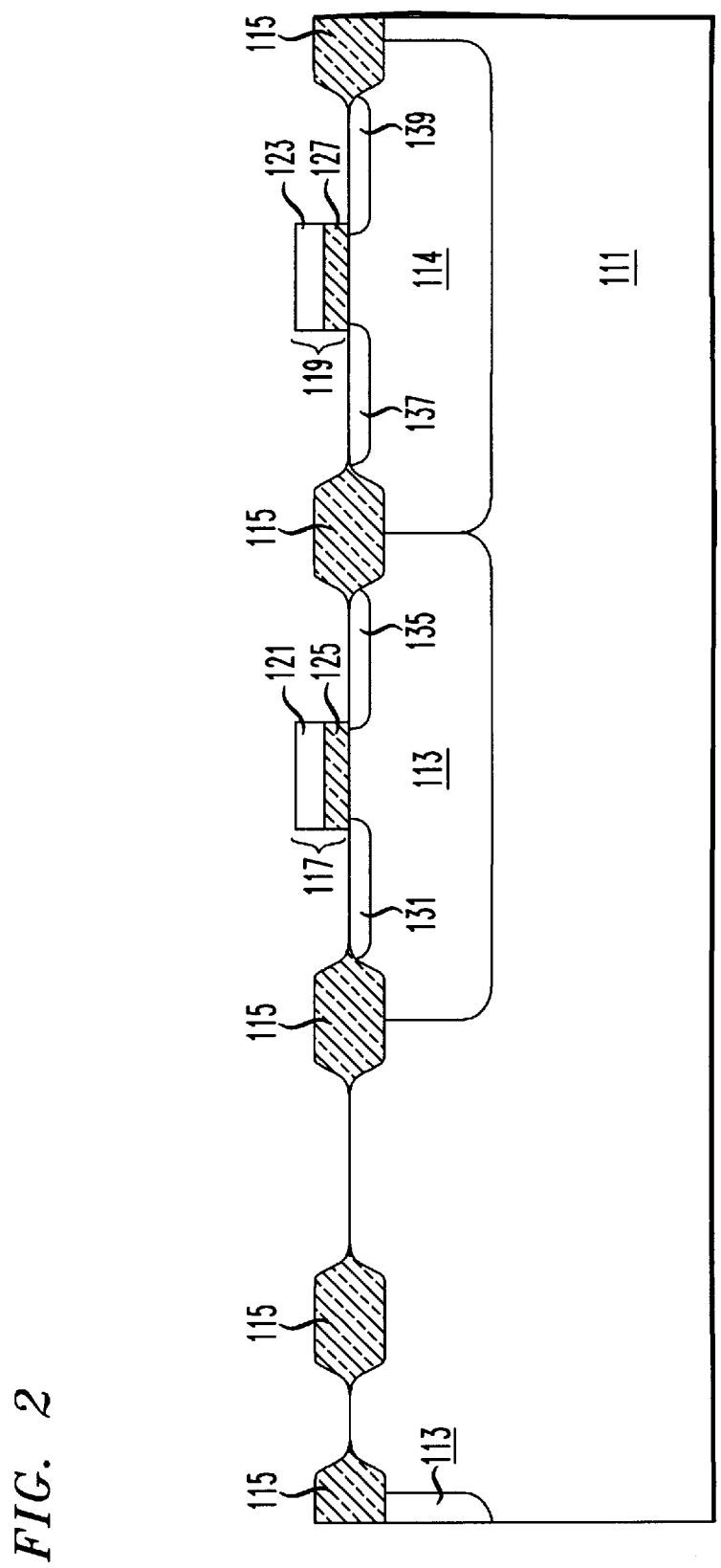
FIGS. 2–7 are cross-sectional views useful in understanding an illustrative embodiment of the present invention.

In FIG. 2, reference numeral 111 denotes a substrate which may illustratively be silicon. An epitaxial layer is not required. A p-tub 113 is formed within substrate 111 by methods known to those of skill in the art. A n-tub 114 is also formed in substrate 111 by methods known to those of skill in the art. (Isolation oxides 115 have already been formed.) Gates 117 and 119 comprising conductors 121 and 123 over oxides 125 and 127 are formed by methods known to those of skill in the art. An n-type implant LDD is performed, thereby creating LDD regions 131 and 135. A p-type implant is next performed, thereby forming p-type LDD regions 137 and 139.

Figure 3:
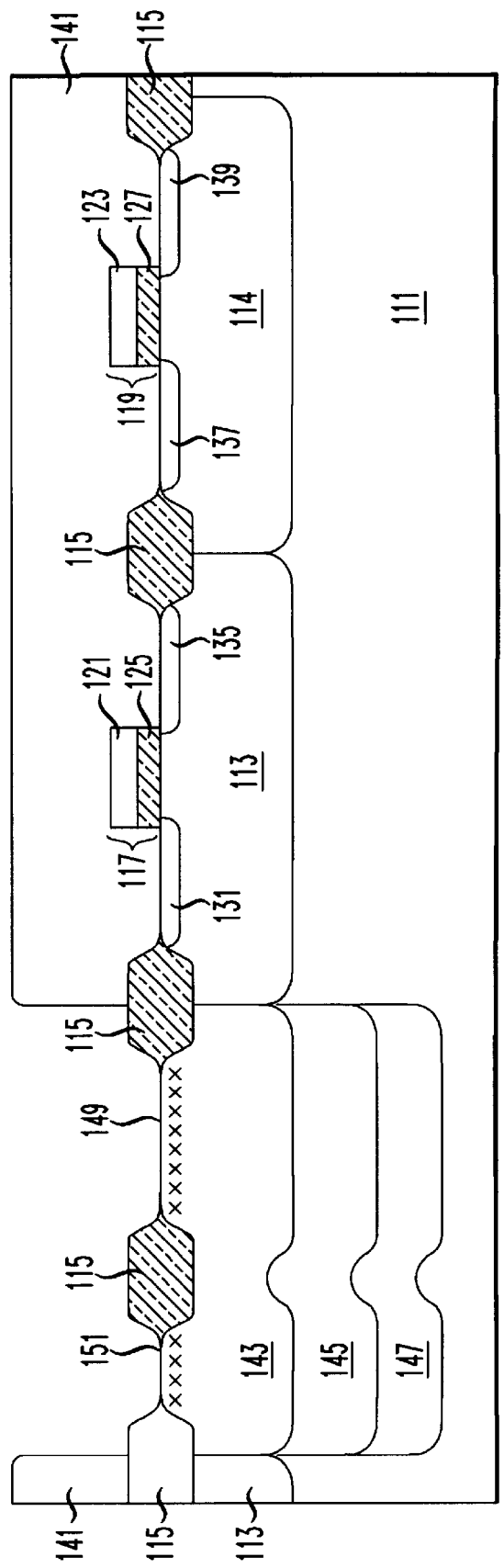

Next, turning to FIG. 3, photoresist 141 is deposited and patterned to cover p-tub 113 and n-tub 114 which contain the partially formed CMOS devices. One or more n-type ion implantations are then performed to form a collector region directly beneath isolation oxide 115 (which extends into substrate 111). Illustratively, a 500 Kev phosphorus implant is performed to define portion 143 of the collector region. It will be noted that, although some of the implanted ions are absorbed by isolation oxide 115, their energy is sufficient that a substantial number penetrate oxide 115. Optional additional n-type implants, illustratively phosphorus implants at for example, 900 Kev and 1.5 MeV are utilized to define portions 145 and 147 of the collector respectively. (Regions 143, 145 and 147 taken together may be considered a collector region.) Finally, a base implant of p-type material may be performed at, illustratively 25 Kev (i.e. a much lower energy) thereby forming implanted region 149 and 151 which flank oxide 115. (Region 151 will eventually be counter doped.) Illustratively, the base is implanted with $BF_2$.

As will be appreciated from the figures which follow, n-type regions 143, 145 and 147 extend continuously beneath isolation oxide 115. These regions taken together form a continuous collector region with a particularly low resistance region especially defined by implant 143.

Figure 4:
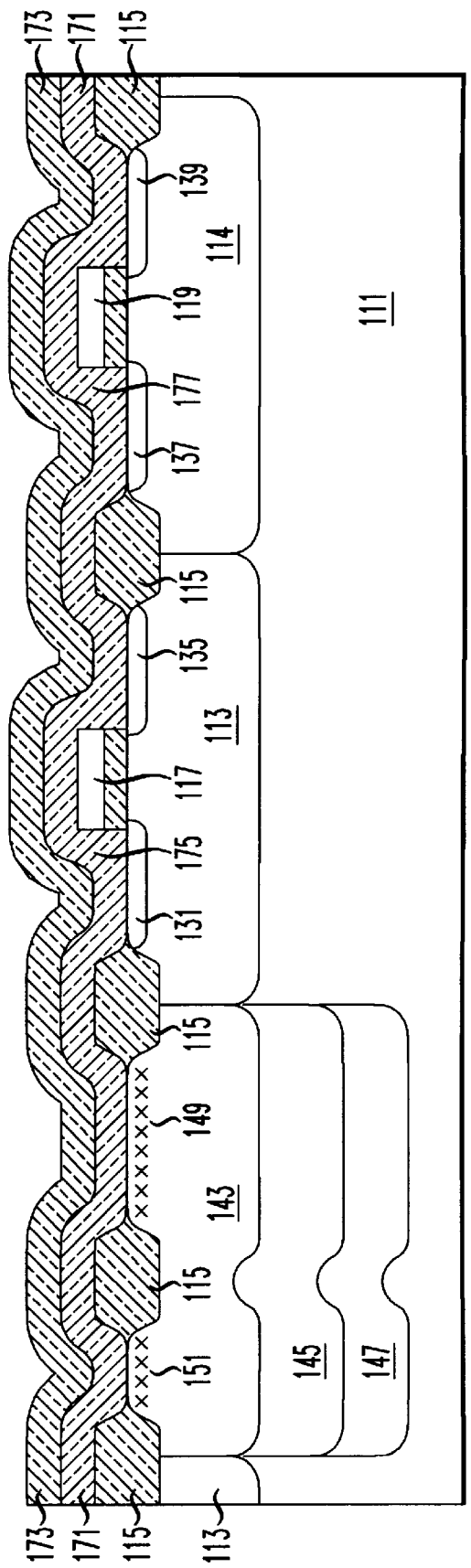

Turning to FIG. 4, a blanket layer 171 of dielectric illustratively made from a chemical precursor such as TEOS is deposited. Illustratively, up to 1600 Å of plasma-enhanced TEOS may be utilized to form a blanket layer. Then the blanket layer is partially etched back, leaving a blanket layer 171 of 600 Å of TEOS and partially forming spacers 175 and 177 at adjacent gates 117 and 119 respectively. Then a second blanket layer, illustratively of amorphous silicon 173 is blanket deposited and patterned above base region 149.

Figure 5:
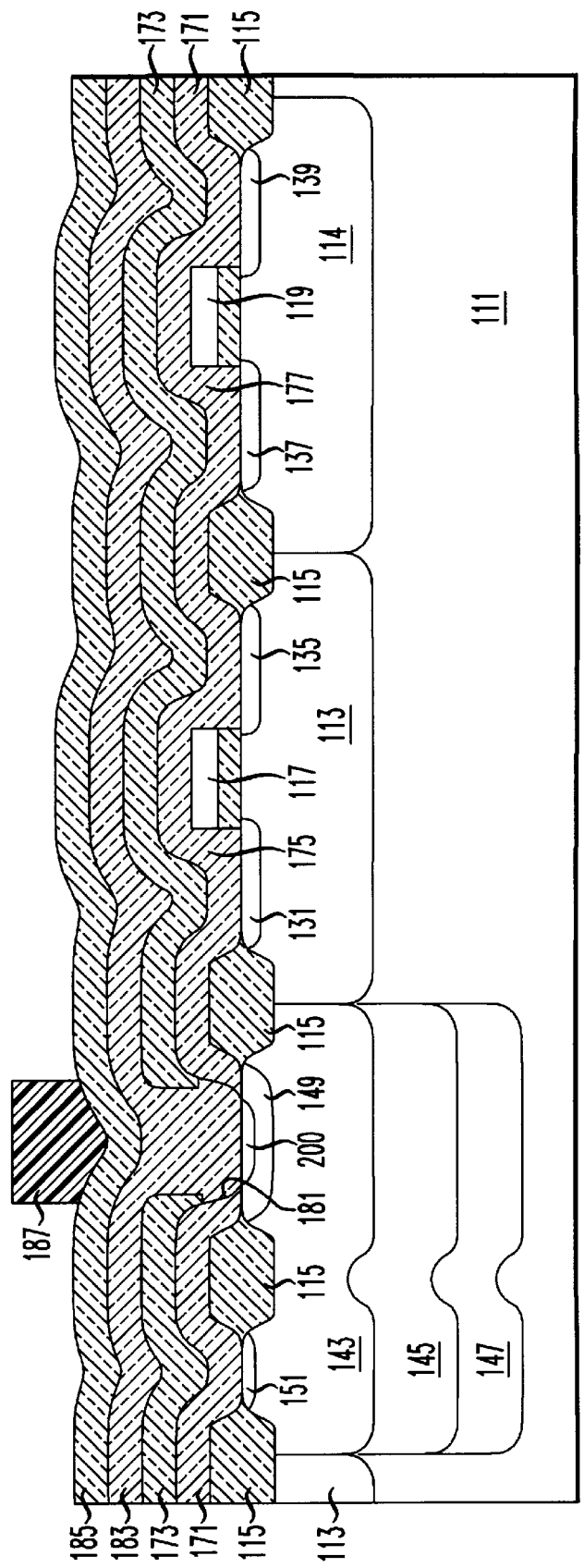

Next, in FIG. 5, dielectric layer 171 is isotropically etched through patterned layer 173, thereby exposing the upper surface of base region 149. It will be noted that the isotropic etching process creates an opening with curved sides 181. A shallow ion implantation, illustratively of arsenic may be performed to create embedded emitter 200. Then a blanket polysilicon layer 183 is deposited. It will be noted that blanket polysilicon layer 183 fills the etched openings in layers 173 and 171. Blanket polysilicon layer 183 is implanted to increase its conductivity. Then a hard mask layer 185 is blanket deposited. Illustratively, layer 185 is formed from PETEOS. A patterned photoresist 187 is formed above hard mask dielectric 185.

Figure 6:
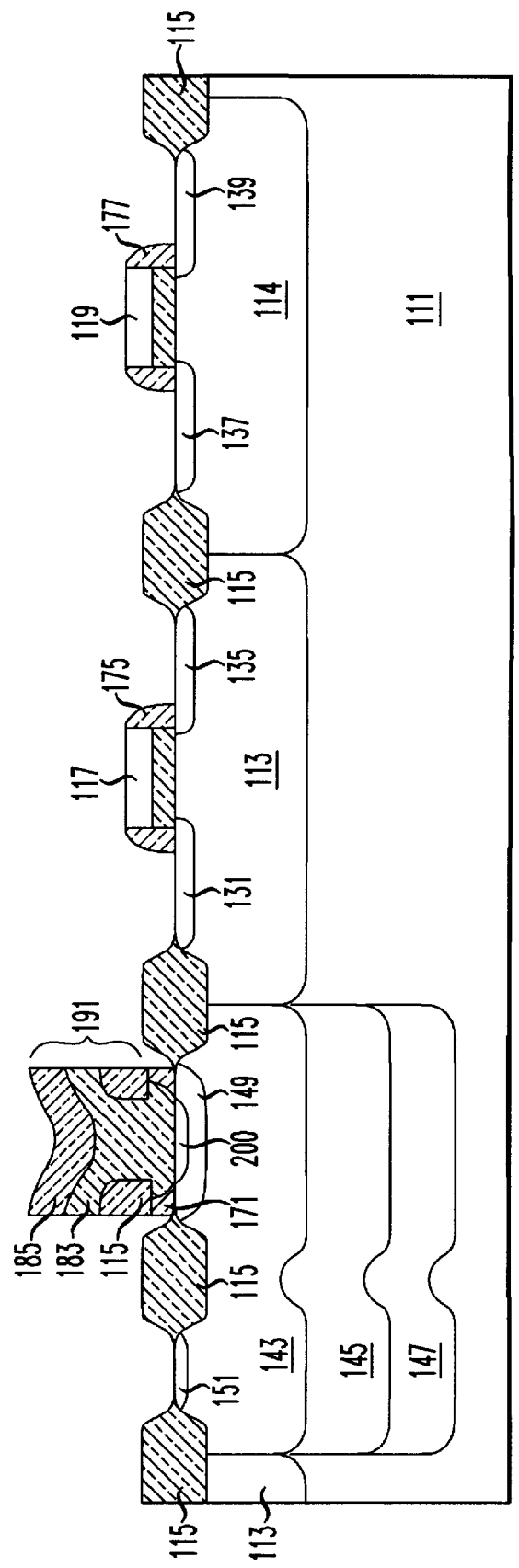

Turning to FIG. 6, an anisotropic etch has been performed, thereby completing the formation of spacers 175 and 177 and defining emitter structure 191.

Figure 7:
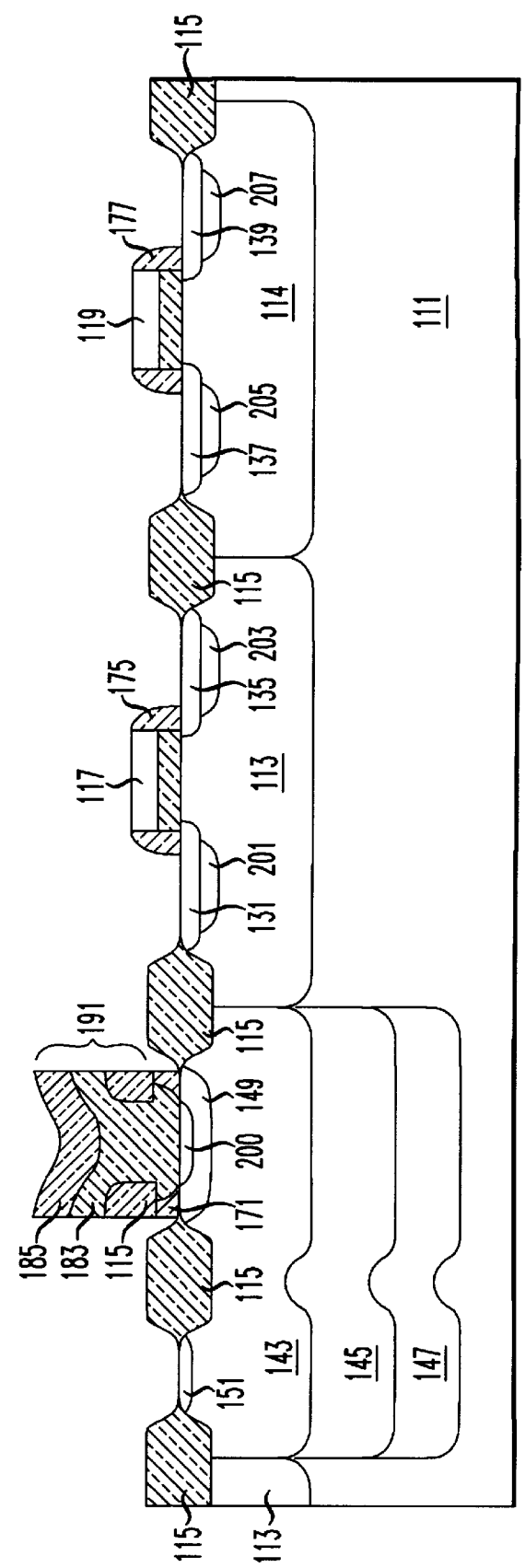

Turning to FIG. 7, using an appropriate mask, an n+ source drain implant 201 and 203 is performed. The n+ source drain implant also counter dopes region 151 of the bipolar collector. Again, after appropriate masking $p^+$ source drain implants 205 and 207 are performed.

Subsequent processing includes blanket deposition of a dielectric, opening of holes in the dielectric to form appropriate contacts to source drain emitter base and collector.

Figure 1:
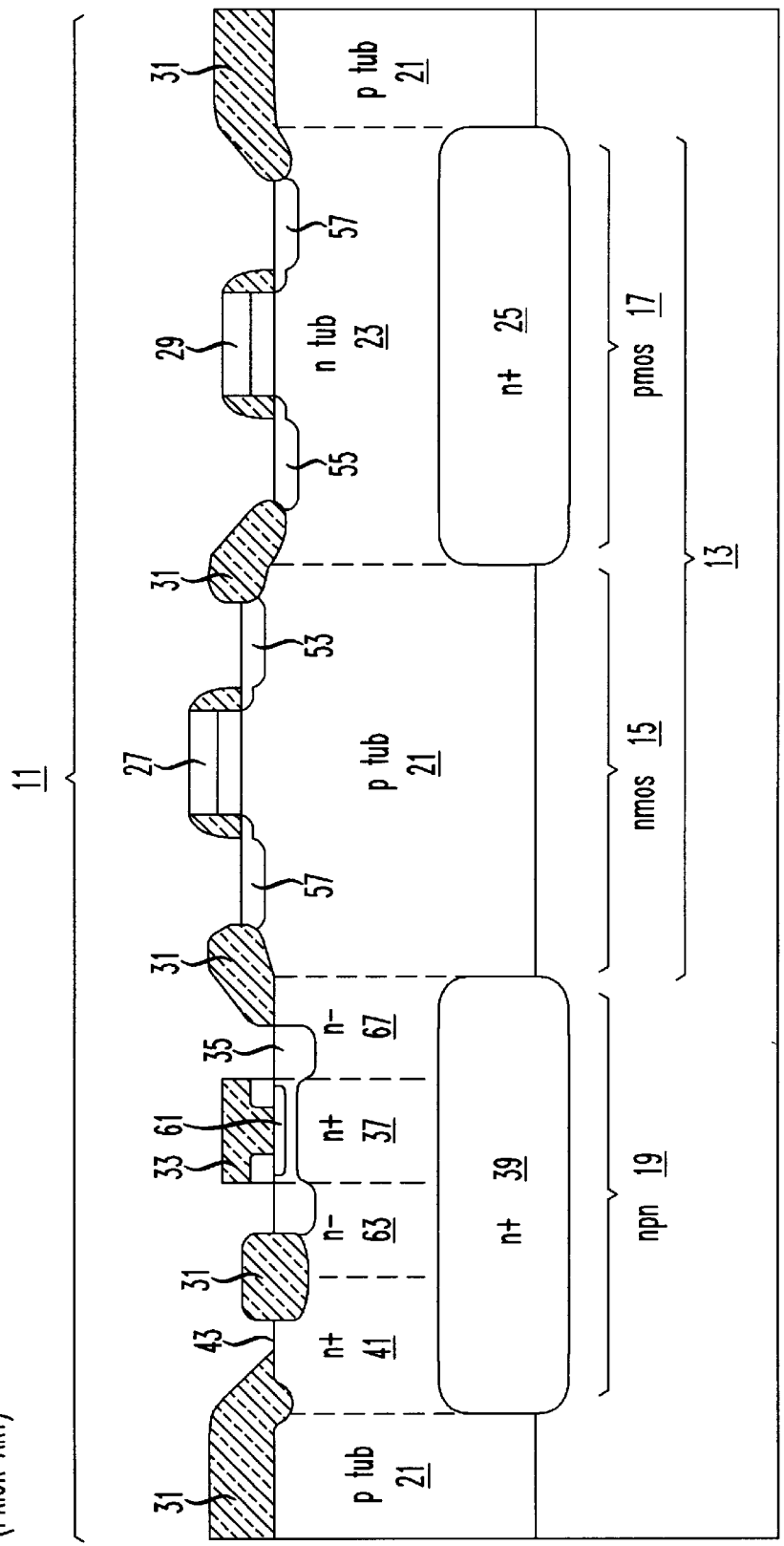
FIG. 1 is a cross section of a typical prior art BiCMOS integrated circuit.

It will be noted that collector region 143 (together with regions 145 and 147) forms a three dimensional conducting path. Current flows from the base 149 beneath oxide isolation 115 to contacts made upon surface 301. The current path depicted in FIG. 7 is much shorter than the collector path depicted, for example, in FIG. 1. The inventive process does not require expensive epitaxial layers.

It will be noted that base region 149 and collector region 143, 145, and 147 are implanted at the same lithographic step. In conventional BiCMOS processes the base implant is coupled to the p-type LDD implants (such as 137 and 139). Thus, the present process provides freedom to design high performance BiCMOS processes without a cost increase.

The single/multiple implanted collector process can be implemented in a variety of BiCMOS environments including those with metal emitters single and double polysilicon processes, epitaxial based processes and epitaxial/implanted germanium based processes. The present process avoids the high doses required of the conventional process of FIG. 1. Illustratively, region 143 is formed from 500 Kev phosphorus at a dose of 9E12 region. Region 145 may be formed from 900 Kev phosphorus at a dose of 3E13. Region 147 an 1.5 MeV implant may be used if desired.

It will be noted, in FIG. 7 that region 143, the lowest resistance region, extends continuously from base 149 beneath oxide 115 to surface 301. Descending vertically into the substrate, region 145 also, part of the collector has the same profile (because it was formed through the same mask) although it is somewhat deeper. The same is true for region 147. Unlike FIG. 1, there is no intervening in n-region 63 which creates a longer collector path. (Although FIG. 1 there is some conduction through region 63, most collector conduction occurs through heavily doped regions 37, 39, and 41.)

The invention claimed is:

1. A method of forming a transistor comprising:
   (a) forming an isolation region extending into a substrate; said isolation region defining first and second portions of said substrate surface;
   (b) subjecting said substrate to more than one first type ion implantation steps to thereby create a region which will later become a collector that extends under said isolation region to said first and second portions of said substrate;
   (c) subjecting said substrate to a second type ion implantation to thereby create a region below second portion of said substrate surface which will later become a base; and
   (d) subjecting the substrate to first type ion implantation through said second portion of said substrate surface to create a region which will later become an emitter.

2. A method of forming a transistor comprising:
   (a) forming an isolation region extending into a substrate; said isolation region defining first and second portions of said substrate surface;
   (b) subjecting said substrate to one or more first type ion implantation steps to thereby create a region which will later become a collector;
   (c) subjecting said substrate to a second type ion implantation to thereby create a region below second portion of said substrate surface which will later become a base;
   (d) forming a blanket dielectric over said first and second portions of said substrate;
   (e) anisotropically etching said dielectric layer to remove a portion of said dielectric layer;
   (f) forming a patterned material masking layer over said dielectric layer;
   (g) isotropically etching said dielectric layer to expose a portion of said second portion of said substrate surface; and
   (h) subjecting the substrate to type ion implantation through said second portion of said substrate surface to create a region which will later become an emitter; said steps (d)–(g) being performed prior to step (h).

3. The method of claim 2 further including the following steps performed subsequent to said emitter implantation step: depositing and patterning a polysilicon layer over said second portion of said substrate surface.

4. The method of claim 1 further including the formation of at least one MOS device upon said substrate.

5. The method of claim 2 in which at least one MOS gate has been formed upon said substrate surface prior to said collector implantation and further in which said blanket dielectric covers said gate and said anisotropic etching step forms partial spacers adjacent said gate.

6. The method of claim 1 wherein each one of the more than one first ion implantation steps are performed at one of different energies and different doses.

7. The method of claim 6 wherein each one of the more than one first ion implantation steps are performed at different energies and different doses.

* * * * *